United States Patent [19]

Kestenbaum et al.

[11] Patent Number: 5,064,685
[45] Date of Patent: Nov. 12, 1991

[54] ELECTRICAL CONDUCTOR DEPOSITION METHOD

[75] Inventors: Ami Kestenbaum, West Windsor Township; Anthony J. Serafino, Cranbury, both of N.J.

[73] Assignee: AT&T Laboratories, Murray Hill, N.J.

[21] Appl. No.: 397,700

[22] Filed: Aug. 23, 1989

[51] Int. Cl.$^5$ .................... B05D 3/06; B05D 5/12; B32B 35/00
[52] U.S. Cl. .................... 427/53.1; 427/96; 427/97; 427/98; 427/123; 427/125; 427/140
[58] Field of Search .................... 427/53.1, 96, 97, 98, 427/123, 140

[56] References Cited

U.S. PATENT DOCUMENTS

| | | | |
|---|---|---|---|
| 4,239,789 | 12/1980 | Blum et al. | 427/53.1 |
| 4,340,617 | 7/1982 | Deutsch et al. | 427/53.1 |
| 4,340,654 | 7/1982 | Campi | 430/5 |
| 4,444,801 | 4/1984 | Hongo et al. | 427/10 |
| 4,511,597 | 4/1985 | Teng et al. | 427/98 |
| 4,526,807 | 7/1985 | Auerbach | 427/96 |
| 4,636,403 | 1/1987 | Fisanick et al. | 427/53.1 |
| 4,933,204 | 6/1990 | Warren, Jr. et al. | 427/53.1 |
| 4,957,775 | 9/1990 | Black et al. | 427/53.1 |
| 4,957,880 | 9/1990 | Itoh et al. | 427/53.1 |
| 4,960,613 | 10/1990 | Cole et al. | 427/53.1 |

OTHER PUBLICATIONS

Ralph T. Hopper, "How to apply noble metals to ceramics," *Ceramic Industry Magazine*, 06/63, pp. 65–76.

*Primary Examiner*—Michael Lusignan
*Assistant Examiner*—Marianne Padgett
*Attorney, Agent, or Firm*—R. B. Anderson

[57] ABSTRACT

A conductive interconnection (27) on a substrate (11) is made by applying a metal-organic compound (25) to the substrate, exposing the metal-organic compound to laser beam radiation (14) in which the power level has been ramped to some specific level and, thereafter, moving the substrate with respect to the laser beam. The movement of the substrate is at an applied rate of speed such that the temperature within the metal-organic compound impinged by the laser beam is properly ramped with respect to time. This leaves a dependable metal deposition (27) which may be monitored through a viewing system (21).

10 Claims, 2 Drawing Sheets

ELECTRICAL CONDUCTOR DEPOSITION METHOD

TECHNICAL FIELD

This invention relates to conductive deposition methods and, more specifically, to methods for making interconnections requiring extremely small conductors.

BACKGROUND OF THE INVENTION

The recent progress of electronics technology has been characterized by an ever-increasing complexity and circuit density of electronic circuits to be defined. Integrated circuit chips are being made with greater numbers of electronic components than before, and such chips are being interconnected to make ever-more complex electronic systems within a small package. As the circuitry defined on each semiconductor chip becomes more dense, the failure of any conductor within the circuit becomes, at the same time, more likely and more expensive, because the value of each chip increases with circuit density.

New generations of circuit packages require new techniques for interconnecting new chips of high circuit density. This requires substrates for supporting the chips which carry on them complex circuitry for interconnecting such chips. One approach, sometimes known as Advanced VLSI Packaging, or AVP, is to use silicon as a substrate for supporting semiconductor chips and to use the same techniques for making complex circuitry on the substrate as are used in defining circuitry on silicon chips. These new-generation substrates tend to be much more expensive than comparable ceramic substrates of the prior art, and, when a conductor is defective, the loss of the substrate represents a greater loss than before.

Because of these two technological trends, the tendency of semiconductor chips to become more complex and more expensive and the need for circuit mounting substrates that are more complex and expensive than before, there has developed a greater need for techniques for repairing spurious conductor breaks that may occur on either a chip or a substrate. Various proposals have been made through the years for controllably depositing metal interconnects for repairing accidental open circuits on chips or substrates, but for the most part these efforts have been unsuccessful. The conductors that are required must typically be a fraction of a micron to a micron thick, and only a few microns wide. There must, of course, be little deviation in their widths to avoid short circuits, and yet the integrity over their lengths must be sufficient to allow dependable current conduction.

The use of redundant circuits has been another solution to the quality control problem. With this scheme, two identical circuits of great complexity are both made on the same chip, the intention being that at least one of them will probably be without flaw. After testing reveals the presence of at least one good circuit, the duplicate circuit is isolated from the rest of the chip by destroying a conductive interconnection to the duplicate circuit, either through the use of a fusible link or by laser cutting of an interconnect. Cutting interconnects is much easier than creating interconnects on a chip, and for this reason there has been no commercial or standard use of a method for selectively connecting, rather than disconnecting, a "redundant" circuit to the remaining circuit of a system.

Thus, there has been a continuing need for a method for selectively depositing with high accuracy and precision dependable electrical conductors of extremely small width and thickness. It has been recognized that such technique would be useful for repairing conductors on both chips and substrates and for making selective interconnections within either chips or substrates. The U.S. Pat. No. 4,636,403 of Fisanick et al, granted Jan. 13, 1987, assigned to subsidiary companies of AT&T, and hereby incorporated by reference herein, describes a method for controllably depositing a spot or patch of material on a substrate, a process that is useful for repairing defects in photomasks. The process involves ramping, or gradually increasing, the power of a laser beam directed at a metal-organic material that overlies the photomask defect. Although the Fisanick et al. patent does not suggest any method for making conductors or repairs to conductors of integrated circuits or the like, applicants have found a way of making use of the Fisanick et al. method to provide such a function.

SUMMARY OF THE INVENTION

In accordance with one embodiment of the invention, a conductive interconnection on a substrate is made by applying a metal-organic compound to the substrate, exposing the metal-organic compound to laser beam radiation in which the power level has been ramped to some specific level and, thereafter, moving the substrate with respect to the laser beam. As will be described in greater detail below, if the substrate is moved at an appropriate rate of speed, such that the temperature within the metal-organic compound impinged by the laser beam is properly ramped with respect to time, there will be a dependable metal deposition along a line described by the intersection of the laser beam with the substrate. This deposition can be monitored through a viewing system, thus permitting the operator to move the substrate so as to form a controllable interconnect between two points on the substrate. One can thereby deposit metal that interconnects two circuit portions on a semiconductor chip, for example.

While in the simplest embodiment described above the power level of the laser beam is constant after being ramped to its final value, this value of laser power should change if the thermal characteristics of the substrate should change. This is important in the interconnection, for example, of two bonding pads on a substrate having a silicon dioxide surface. As the conductor is being defined over the metal bonding pads the laser power used should normally be several times higher than the laser power used when the conductor is being defined over the silicon dioxide substrate. This is because the thermal dissipation of the metal bonding pad is much greater than that of silicon dioxide. Design rules for correlating laser beam power level and substrate movement with the thermal characteristics of the substrate will be given below. As will be seen later, it is possible to make extended conductive interconnections on the order of only ten microns wide on a semiconductor chip that will dependably conduct current during subsequent operation as part of an integrated circuit.

These and other objects, features and advantages of the invention will be better understood from a consideration of the following description taken in conjunction with the accompanying drawings.

DETAILED DESCRIPTION

Figure 1:
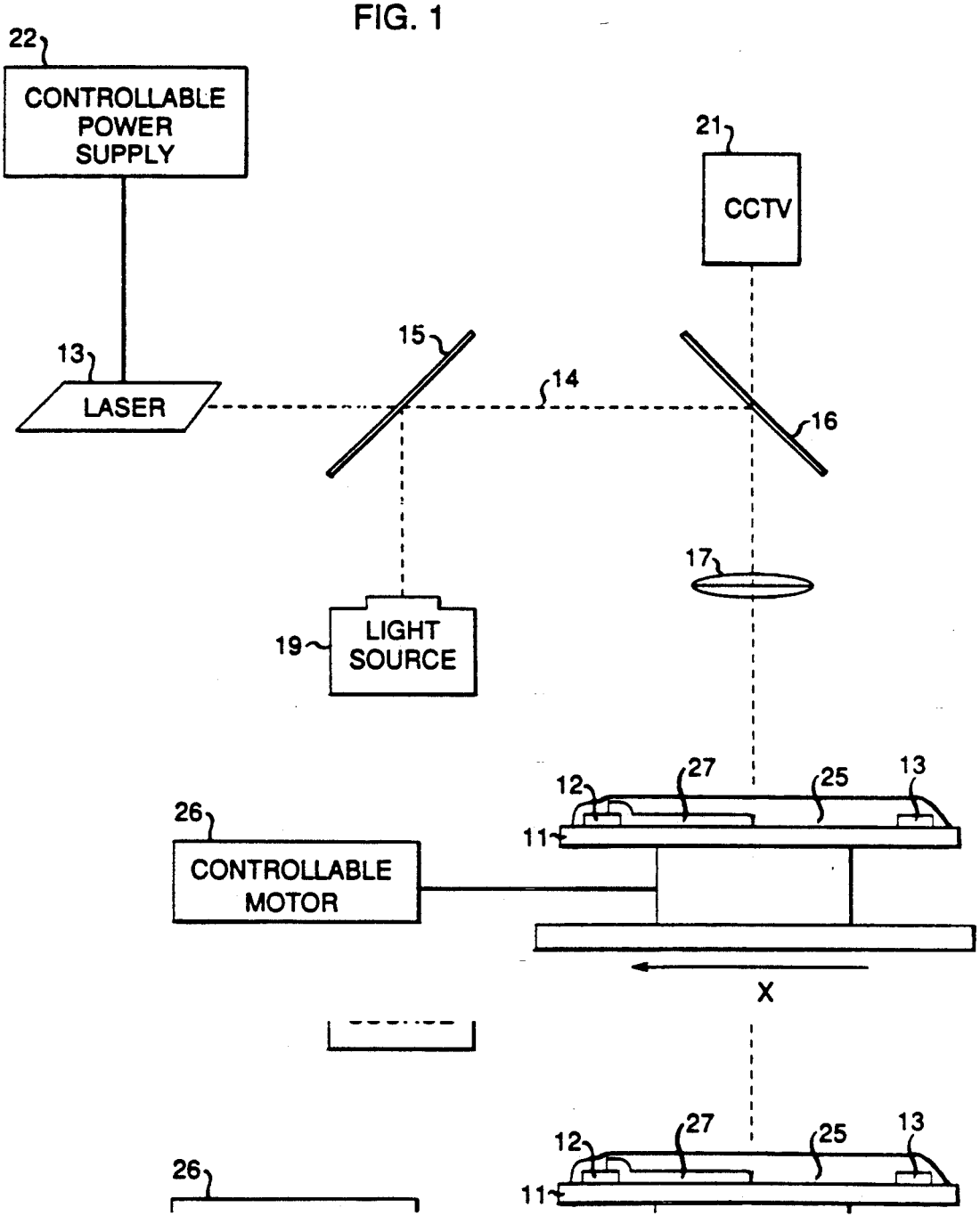
FIG. 1 is a schematic diagram of apparatus for depositing conductors in accordance with an illustrative embodiment of the invention.

Referring now to FIG. 1, there is shown schematically apparatus for defining a metal conductor on the surface of a semiconductor chip or integrated circuit substrate 11 in accordance with the principals of the present invention. For reasons that will become evident later, the relative dimensions of the various elements of FIG. 1 are not to scale, but rather are grossly out of scale with respect to each other. The semiconductor substrate 11 is intended to represent a semiconductor integrated circuit chip that may have, typically, dimensions of only about one centimeter on a side, while other components in the figure are relatively much larger. The purpose of the process illustrated is to make a controllable conductive interconnection between metallic bonding pads 12 and 13, such as gold, on the surface of the substrate 11. It is to be understood, however, that the invention is applicable to other devices and other substrates; specifically, it is admirably suited to the need for repairing conductors on the surface of AVP substrates, including such AVP substrates as may be coated with polyimide.

The apparatus includes a laser 13 which may, for example, be a continuous wave argon ion laser of the type that is available as Model 171-19 from Spectra-Physics, Inc. of Mountainview, Calif. The laser beam is projected along a path 14 which passes through a first dichroic mirror 15 and is reflected from a second dichroic mirror 16 through an objective lens 17 to the substrate 11. The first dichroic mirror 15 also reflects white light from a source 19 onto a path coincident with path 14; the second dichroic mirror 16 reflects the white light along with the laser beam toward the substrate 11. The objective 17 is typically a microscope objective, and it condenses and focuses both the laser beam and the white light onto the substrate surface 11. White light reflected back through objective 17 passes through second dichroic mirror 16 and is intercepted by a closed circuit television camera 21. The image projected to television camera 21 is a magnified image of the intersection of path 14 with the surface of the substrate 11. The laser 13 is connected to a controllable power supply 22 which allows control of the laser power level.

In accordance with the invention, the substrate surface 11 is coated with a metal-organic ink material 25 which may be applied, for example, by spin coating over the entire surface a wafer containing the substrate 11 to a thickness of, for example, approximately two microns. The ink may illustratively be bright gold A3728 screen ink commercially available from Englehard, Inc. of East Newark, N.J. Such ink is formed from gold chloride in solution with a polymer forming compound to form a gold terpene mercaptide. Gold is the principle metallic component and the ink is widely used commercially for making decorative gold films. After application, the substrate may be dried for twenty minutes at ninety degrees Centigrade to remove certain volatile, organic solvents from the metals organic ink 25.

After drying, an operator controls projection of the laser beam onto a desired part of the substrate surface by first using the reflected white light to observe, by means of television camera 21, the point at which the laser beam will impinge on the surface. The operator then causes the power supply 22 to actuate the laser 13. When the laser beam is initially actuated, the laser power is ramped up, or gradually increased, to some constant level. This ramp-up is important for completely volatilizing and vaporizing the organic material, thereby to avoid contamination of the deposited metal film. The controllable power supply 22 may include a computer that delivers a gradually increasing voltage to the laser and thereafter delivers a constant voltage level to give a corresponding variation in laser output power. The focused laser beam pyrolyzes the ink to leave a deposited metal film.

Figure 2:
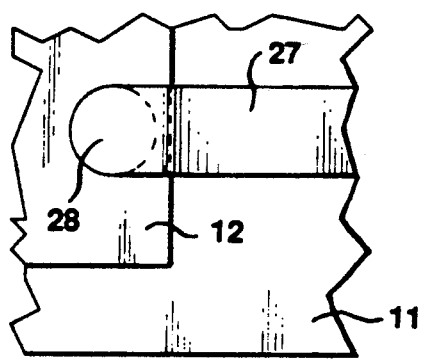
FIG. 2 is a top view of part of the integrated circuit of FIG. 1 showing how a continuous conductor is defined along the surface of the integrated circuit.

After the initial deposition of metal has been made through successful pyrolysis of the metal-organic ink, the substrate 11 is moved in an X direction, as shown in FIG. 1, by means of a controllable motor 26. As the substrate 11 moves with respect to the path of the laser beam 14, continuous pyrolysis of the metal-organic ink results in the deposition of a continuous metal film conductor 27. A top view of part of the substrate 11 is shown in FIG. 2., the view shown being similar to one that would be viewed microscopically through the CCTV camera 21. The laser beam is initially centered on a spot 28 on metal pad 12. As the ink pyrolyzes, one can visually see a gold spot 28 forming. When one sees that it has formed appropriately, one then operates controllable motor 26 to move the substrate 11 in the X direction as shown in FIG. 1. This causes the spot to "move" along the substrate and if such movement is at a proper speed, a dependable conductor 27 is deposited during the movement. After the lead has been completed and makes connection with bonding pad 13, the process is, of course, terminated and the deposition is completed.

As the substrate moves relative to the laser spot, the temperature rise in the ink must be appropriately gradual, or in other words, the temperature rise must be ramped during deposition onto the substrate just as the laser power is ramped for the initial deposition. The speed of the substrate necessary for giving appropriate ramping can be derived from the general expression for temperature ramping needed to give complete pyrolyzation. The temperature T may be estimated by the expression $$T = \frac{P}{\pi^{3/2} k r_0} \int_0^\infty f(u) du \qquad (1)$$

where $$f(u) = \frac{1}{u^2 + 1} \exp\left[ -\left( \frac{(X + Vu^2)^2 + Y^2}{u^2 + 1} + \frac{Z^2}{u^2} \right) \right] \qquad (2)$$

where P is the absorbed power in the ink, k is the thermal conductivity of the ink, $r_0$ is the radius of the laser spot, X, Y, and Z are positional variables that are normalized with respect to $r_0$, and the parameter V is given by $$V = \frac{v r_0}{4D} \quad (3)$$

where D is the thermal diffusivity of the ink, and v is the velocity of the movement of the substrate in the X direction as shown in FIG. 1.

Figure 3:
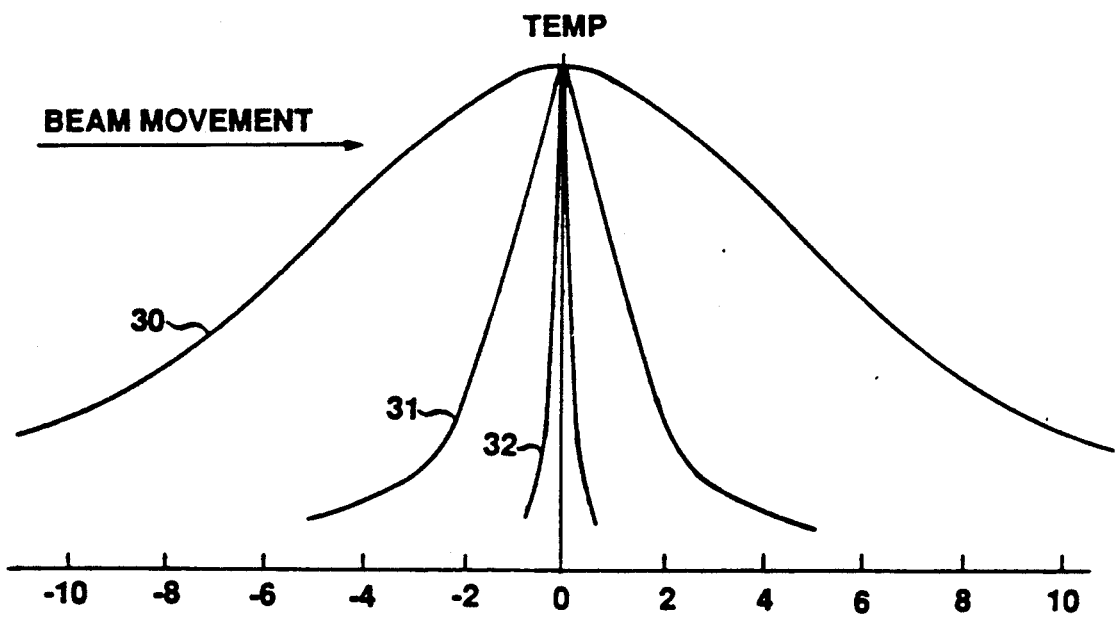
FIG. 3 is a graph of temperature versus time for various velocities of the laser beam on the surface of the integrated circuit of FIG. 1.

Assuming a near thermally insulative substrate, the temperature T in accordance with the above relationships is plotted in FIG. 3 as a function of time in seconds. Curve 30 is a plot of temperature versus time with a substrate velocity v equal to one micron per second. Graph 31 shows the change of temperature with a velocity of five microns per second and Curve 32 shows temperature change with a velocity of fifty microns per second. With the metal-organic ink described, the temperature ramp-up time should be between two and five seconds to give complete pyrolysis. One can see from FIG. 3 that this would be obtained by making the scanning rate between one and five microns per second. If it were as much as fifty microns per second, the temperature ramp-up time as shown by Curve 32 would be inadequate; that is, the temperature would be ramped to maximum during a time of much less than two seconds.

If deposition is made on a metal substrate, one must take into account the significant heat drain from the ink by the substrate. We have found experimentally that the laser power required for pyrolysis on a highly conductive substrate is about four times that required on a generally insulative substrate. Thus, in the apparatus of FIG. 1, the operator should control the laser power to be approximately four times as high during the period at which the laser spot impinges the bonding pad 27 as when it impinges the substrate 11. This is best accomplished by having the substrate move in the X direction at a constant speed, beginning to reduce power as the laser spot first touches the substrate 11 and completing the transition to a lower power as the laser spot leaves the bonding pad 12 and is fully focused on the substrate 11. After bonding pad 13 is reached, the laser power is again increased so that metal deposition conditions match those that were obtained during deposition bonding pad 12.

With the metal-organic ink described above, the resulting conductor was about one thousand angstroms (0.1 micron) thick with a resistivity of about $8 \times 10^{-6}$ ohm-centimeters. This resistivity is only about four times greater than that of bulk gold, implying a very high gold purity and excellent electrical conductor characteristics. Auger and Rutherford back scattering (RBS) analysis revealed traces of impurities of under 2% of vanadium, sulfur, carbon and oxygen which were not completely volatilized out from the original ink. The film thus, has good electrical properties, and we have found that it adheres well to the metal and silicon dioxide substrates. Reliable continuous conductors ten microns wide and as much as one centimeter long have been made. The continuous wave argon laser had a wave-length of 5145 angstroms. The lens 17 was a 100× objective used to focus the laser light to a spot of about ten microns. For deposition on the gold bonding pads, the laser power used was 250 mW and for deposition on the silicon dioxide the laser power was 65 mW.

Various experiments were made with different laser powers. We have found that, with the laser power being measured at the substrate 11, the range of 150-300 mW was satisfactory for depositing gold on gold bonding pads and a power of 50-85 mW was satisfactory for gold deposition on silicon dioxide. We have also deposited gold on polyimide and have found that the polyimide requirements were the same as for those on silicon dioxide. Although the drawing shows only substrate movement in the X direction, in the experiments that we have done, the substrate was mounted on an X-Y table of a type commonly used in the semiconductor industry and, by using such apparatus, conductors may be made extending in any direction in two dimensions. The Fisanick patent teaches the addition of a titanium base metal resinate solution to the metal-organic ink to increase adhesion. Where the deposited metal is used as a conductor in accordance with this invention, it is important that such additives be avoided since they interfere with a good electrical conduction.

In FIG. 1, bonding pad 12 may be taken to represent one of two duplicate circuits and bonding pad 13 as the main circuit of an integrated circuit, in which case the method is one for selectively connecting a "redundant" circuit, to a larger circuit system. Alternatively, bonding pads 12 and 13 may be considered as opposite portions of an accidentally broken conductor of either an integrated circuit chip or an AVP substrate, in which case the process described is one for repairing the broken conductor. In the case of an AVP package, the surface of the substrate 11 could be coated with polyimide.

We have demonstrated a technique for making dependable electrical conductors on a variety of surfaces. The ability to make a continuous conductor covering both metal and insulative surfaces, points to a number of practical uses, some of which have been described in detail. These and other uses, as well as various other modifications and embodiments of the invention other than those specifically shown and described, may be made by those skilled in the art without departing from the spirit and scope of the invention.

We claim:

1. A method for depositing an electronic conductor on a substrate comprising the steps of: applying a metal-organic compound to the substrate; exposing the metal-organic compound to light radiation from a laser; initially ramping the power level of the light radiation delivered to the metal-organic compound to cause said compound to decompose to volatile components and a metal film which is adherent to the substrate, characterized by:

calculating the maximum speed of relative movement between the light radiation and the metal-organic compound permitted for giving sufficient temperature ramping in the metal-organic compound to permit an ordered deposition of metal from the metal-organic compound through pyrolyzation of the metal-organic compound;

thereafter causing relative movement between the substrate and the laser radiation, the relative movement being at a controlled speed less than said maximum speed to give a temperature ramping of the metal-organic compound along a line, so as to pyrolyze the metal-organic compound to volatile components with a consequent ordered deposition of metal film along a line to constitute an electronic conductor.

2. The method of claim 1 further characterized in that:

the electronic conductor constitutes an electrical interconnection between a first circuit portion on the substrate and a second circuit portion on the substrate.

3. The method of claim 1 further characterized in that:

an extended portion of the line is defined on a substrate surface of a first material, and during deposition on the substrate surface of the first material, the speed of the relative movement and the power of the laser are substantially constant.

4. The method of claim 3 further characterized in that:

another portion of the line is defined on a substrate surface of a second material having a significantly higher thermal conductivity than the first material; and during deposition on the substrate surface of the second material, the speed of the relative movement and the power of the laser beam are substantially constant, but the power of the laser beam is significantly higher than the laser beam power during deposition on the substrate surface of the first material.

5. The method of claim 4 further characterized in that:

the relative movement is caused by keeping the laser radiation stationary and moving the substrate.

6. The method of claim 5 further characterized in that:

the first material is silicon dioxide and the second material is gold.

7. The method of claim 6 further characterized in that:

during deposition over the gold portion of the substrate, the laser power is substantially four times greater than the laser power during deposition over the silicon dioxide portion of the substrate.

8. A method for selectively interconnecting first and second bonding pads separated by an insulative substrate or an integrated circuit comprising the steps of:

covering the bonding pads and the intervening insulative substrate with a metal-organic compound;

forming and focusing on the first bonding pad a laser beam having a diameter approximately equal to the desired width of the electrical interconnection;

initially ramping the power of the laser beam to a first constant power, said ramping being to a sufficient power level to pyrolyze the metal-organic compound and cause deposition therefrom of metal onto the first bonding pad;

moving the substrate with respect to the laser beam such that the laser beam scans a path from the first bonding pad to the second bonding pad;

reducing the power of the laser beam from the first constant power to a second constant power that is significantly lower than the first constant power as the laser beam path moves from the first bonding pad to the insulative substrate;

increasing the laser power from the second constant power to the first constant power as the laser beam path moves from the insulative substrate to the second bonding pad;

all movements of the substrate with respect to the laser beam being at speeds lower than a calculated maximum speed permitted for giving sufficient temperature ramping in the metal-organic compound to permit an ordered deposition of metal therefrom through pyrolyzation of the metal-organic compound.

9. The method of claim 8 wherein:

the first constant power is about four times higher than the second constant level.

10. The method of claim 9 wherein:

the bonding pads are gold, the insulative substrate is silicon dioxide and the metal-organic compound has gold as its principle metal component.

* * * * *